(12) United States Patent
Kim

(10) Patent No.: US 8,943,262 B2
(45) Date of Patent: Jan. 27, 2015

(54) NON-VOLATILE MEMORY DEVICE

(75) Inventor: Min-Su Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 538 days.

(21) Appl. No.: 13/309,198

(22) Filed: Dec. 1, 2011

(65) Prior Publication Data
US 2012/0159048 A1 Jun. 21, 2012

(30) Foreign Application Priority Data
Dec. 17, 2010 (KR) .................. 10-2010-0129599

(51) Int. Cl.
G06F 13/00 (2006.01)
G06F 13/28 (2006.01)
G11C 16/26 (2006.01)
G11C 16/32 (2006.01)

(52) U.S. Cl.
CPC ............... *G11C 16/26* (2013.01); *G11C 16/32* (2013.01)
USPC .................. 711/103; 711/E12.002; 713/401; 365/233.1

(58) Field of Classification Search
USPC ......... 711/103, E12.002; 713/401; 365/233.1
See application file for complete search history.

(56) References Cited

U.S. PATENT DOCUMENTS

| 5,206,944 A | * | 4/1993 | Pilkenton ........................ 711/5 |
| 6,333,894 B1 | * | 12/2001 | Nakayama et al. ...... 365/233.19 |
| 2001/0039602 A1 | * | 11/2001 | Kanda et al. .................. 711/105 |
| 2007/0086261 A1 | * | 4/2007 | Freebern .................. 365/230.03 |
| 2007/0250677 A1 | * | 10/2007 | Ware et al. ..................... 711/167 |

* cited by examiner

Primary Examiner — Edward Dudek, Jr.
(74) Attorney, Agent, or Firm — IP & T Group LLP

(57) ABSTRACT

A non-volatile memory device includes a first bank including a plurality of first page buffers, a second bank including a plurality of second page buffers, and an address counter configured to count a first address and a second address in response to a clock before a first time in a period for performing a read operation and count the first address and the second address in response to a bank address after the first time, wherein data of the first page buffers are sequentially outputted in response to the first address, and data of the second page buffers are sequentially outputted in response to the second address.

16 Claims, 5 Drawing Sheets

NON-VOLATILE MEMORY DEVICE

CROSS-REFERENCE TO RELATED APPLICATIONS

The present application claims priority of Korean Patent Application No. 10-2010-0129599, filed on Dec. 17, 2010, which is incorporated herein by reference in its entirety.

BACKGROUND

1. Field

Exemplary embodiments of the present invention relate to a non-volatile memory device.

2. Description of the Related Art

When a non-volatile memory device performs a read operation, data is outputted sequentially. For example, when a read command is first applied through an input/output pad and an address is applied, an address is counted from the applied address and the data stored in a page buffer corresponding to each address is sequentially outputted. Such a read operation is referred to as a serial read operation. Hereafter, a serial read operation of a non-volatile memory device is described.

FIG. 1 illustrates a conventional non-volatile memory device.

The non-volatile memory device shown in FIG. 1 includes a first bank 110 including a plurality of first page buffers $A_1$ to $A_N$, a second bank 120 including a plurality of second page buffers $B_1$ to $B_N$, and an address counter 130 that counts a first address ADD1<0:A> and a second address ADD2<0:A>.

Hereafter, the operation of the non-volatile memory device is described with reference to FIG. 1.

First, a read command is inputted to an input/output pad (not shown in FIG. 1) while a command latch enable (CLE) signal is enabled to a logic high level. Subsequently, an initial bank address BADD_INT, a page address, and a column address ADD_INT<0:A> are inputted to the input/output pad while an address latch enable (ALE) signal is enabled to a logic high level. The address counter 130 receives the initial bank address BADD_INT and the column address ADD_INT<0:A> while a load signal LOAD is enabled.

The initial bank address BADD_INT designates whether the data of the first bank 110 or the data of the second bank 120 is to be outputted during a multi-bank operation. The column address ADD_INT<0:A> indicates which page buffer from the multiple page buffers $A_1$ to $A_N$ and $B_1$ to $B_N$ of the banks 110 and 120 to output data. Also, the value of the first address ADD1<0:A> designates one page buffer among the multiple first page buffers $A_1$ to $A_N$, and the value of the second address ADD2<0:A> designates one page buffer among the multiple second page buffers $B_1$ to $B_N$.

Subsequently, a word line WLK designated by the page address is enabled. The data of a memory cell corresponding to the enabled word line WLK in a first memory array 111 is stored in the multiple first page buffers $A_1$ to $A_N$, and the data of a memory cell corresponding to the enabled word line WLK in a second memory array 121 is stored in the multiple second page buffers $B_1$ to $B_N$.

The non-volatile memory device performs a multi-bank operation, which means outputting the data stored in two or more banks, during a read operation. To perform the multi-bank operation, the address counter 130 counts a bank address BADD, the first address ADD1<0:A>, and the second address ADD2<0:A> from a time when the command latch enable (CLE) signal and the address latch enable (ALE) signal are enabled together. When the command latch enable (CLE) signal and the address latch enable (ALE) signal are enabled together is referred to as a first time, hereafter. The initial value of the bank address BADD is the initial bank address BADD_INT, and the initial values of the first address ADD1<0:A> and the second address ADD2<0:A> are both the column address ADD_INT<0:A>.

The bank address BADD is counted at a rising edge of a clock CLK. The data stored in the first page buffers between a starting first page buffer $A_3$ and an ending first page buffer $A_{N-1}$, which are designated by the column address ADD_INT<0:A> while the first address ADD1<0:A> is counted, are sequentially outputted at a rising edge of the bank address BADD. The data stored in the second page buffers between a starting second page buffer $B_3$ and an ending second page buffer $B_{N-1}$, which are designated by the column address ADD_INT<0:A> while the second address ADD2<0:A> is counted, are sequentially outputted at a falling edge of the bank address BADD.

In the conventional non-volatile memory device, the outputted data is stored in a plurality of pipe latches (not shown in FIG. 1) and outputted to a circuit outside of the non-volatile memory device through the input/output pad.

FIG. 2 is a waveform diagram illustrating the operation of the conventional non-volatile memory device.

After a command and an address are inputted through the input/output pad, a period for performing a read operation begins at a falling edge 201 of a 'W/R#' signal. Here, when the 'W/R#' signal is in a logic low level, it means a period for performing a read operation, and when the 'W/R#' signal is in a logic high level, it means a period for performing a write operation.

In the period for performing a read operation, a clock CLK is enabled after a first time 202. The address counter 130 counts the bank address BADD at a rising edge of the clock CLK. The address counter 130 also counts the first address ADD1<0:A> at a rising edge 203 of the bank address BADD, and the address counter 130 counts the second address ADD2<0:A> at a falling edge 204 of the bank address BADD. Here, the clock CLK is generated by inverting a source clock SCLK and enabling the clock CLK for a designated duration.

The clock CLK is disabled in response to the command latch enable (CLE) signal and the address latch enable (ALE) signal being set to a low logic level at a latch disable time 205, and the counting operation of the bank address BADD, the first address ADD1<0:A>, and the second address ADD2<0: A> are ended.

FIG. 2 shows an operation when the initial bank address BADD_INT is '0' and the column address ADD_INT<0:A> is '10001'. The initial bank address BADD_INT begins from '0' and toggles between '0' and '1'. The first address ADD1<0:A> and the second address ADD2<0:A> are counted from '10001' to '10100'.

As the operation rate of a non-volatile memory device becomes faster, it becomes important to rapidly output data from the page buffers. If data is pre-stored in the pipe latch, fast output operations may be performed.

The value of the bank address BADD has to be the same as the initial bank address BADD_INT at the first time 202. If the value of the bank address BADD is different from the initial bank address BADD_INT at the first time 202, the order of outputting data being outputted from the pipe latch to the input/output pad becomes different.

However, when one period of a clock CLK is longer than 'tWRCK', which is a value based on the ONFI specification, a rising edge of the clock CLK appears once in a 'tWRCK' period. Thus, the bank address BADD is toggled once and the value of the bank address BADD becomes different from the initial bank address BADD INT.

Therefore, according to the conventional technology, the bank address BADD cannot be counted before the first time 202 and the first address ADD1<0:A> and the second address ADD2<0:A>, which are counted at the rising and falling edges of the bank address BADD, cannot be counted either. As a result, data cannot be stored in the pipe latch before the first time Thus, an error may occur during a high-speed operation.

Herein, 'tWRCK' means the time from the first rising edge of the source clock SCLK after the 'W/R#' signal transitions to a logic low level to the first rising edge of the source clock SCLK after the command latch enable (CLE) signal and the address latch enable (ALE) signal transition to a logic high level.

SUMMARY

An embodiment of the present invention is directed to a non-volatile memory device that may perform a high-speed operation by counting an address before a first time and outputs the data of a page buffer before a first time when a period for performing a read operation begins.

In accordance with an embodiment of the present invention, a non-volatile memory device includes: a first bank including a plurality of first page buffers; a second bank including a plurality of second page buffers; and an address counter configured to count a first address and a second address in response to a clock before a first time in a period for performing a read operation and count the first address and the second address in response to a bank address after the first time, wherein data of the first page buffers are sequentially outputted in response to the first address, and data of the second page buffers are sequentially outputted in response to the second address.

In accordance with another embodiment of the present invention, a non-volatile memory device includes: a bank including a plurality of page buffers; and an address counter configured to count an address in response to a clock before a first time in a period for performing a read operation and count the address in response to bank address after the first time, wherein data of the page buffers are sequentially outputted in response to the address.

DETAILED DESCRIPTION

Figure 1:
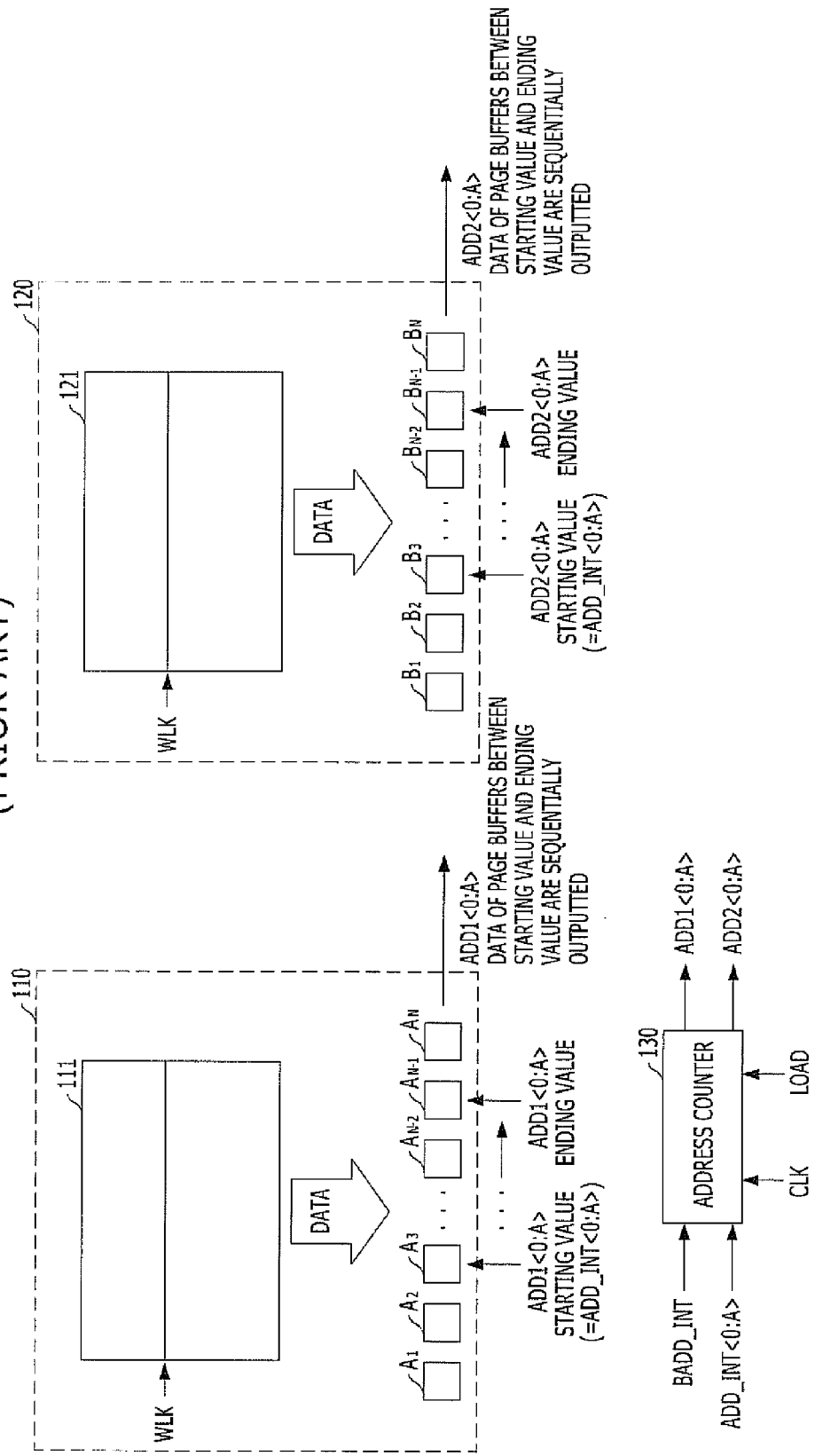
FIG. 1 illustrates a conventional non-volatile memory device.
Figure 2:
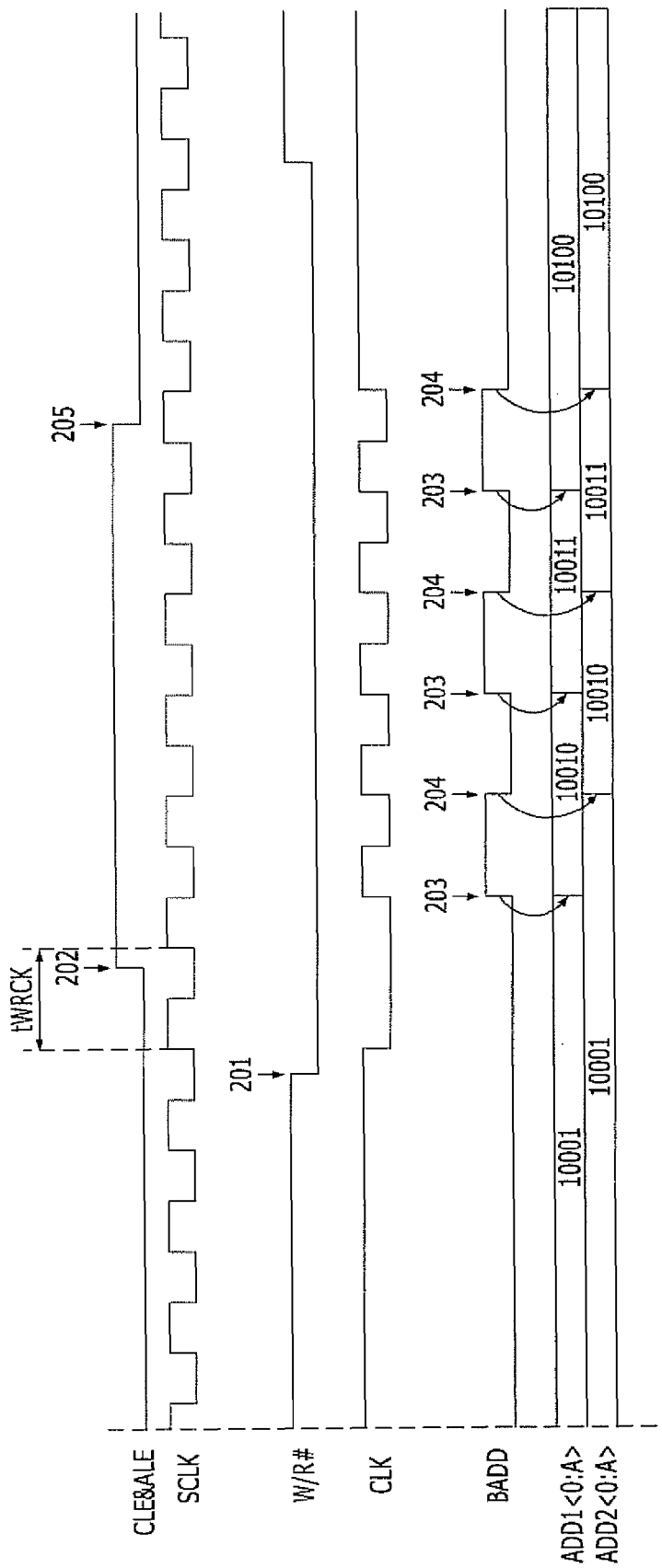
FIG. 2 is a waveform diagram illustrating the operation of the conventional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
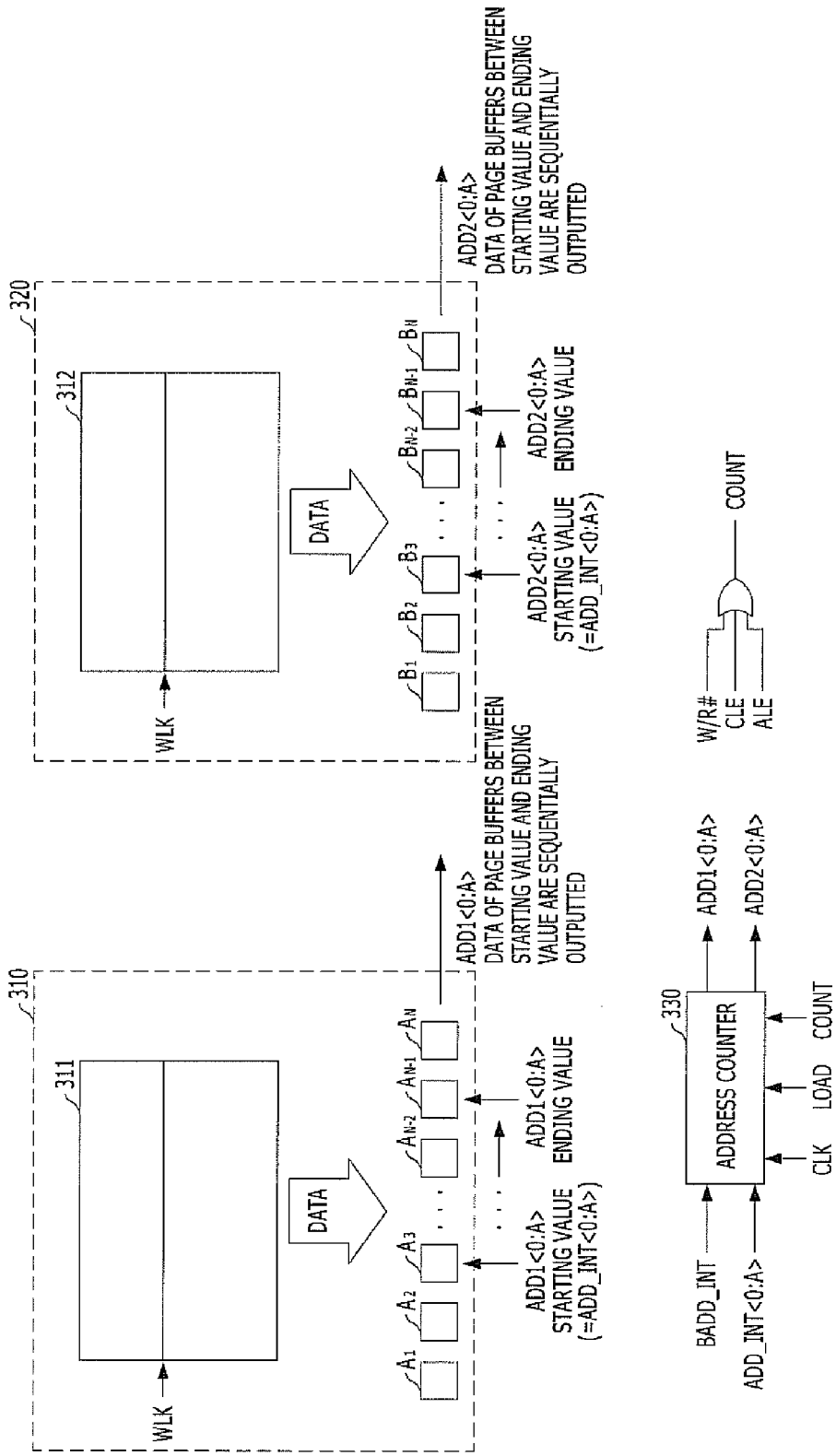
FIG. 3 is a block diagram of a non-volatile memory device in accordance with an embodiment of the present invention.

FIG. 3 is a block diagram of a non-volatile memory device in accordance with an embodiment of the present invention.

The non-volatile memory device shown in FIG. 3 includes a first bank 310 including a plurality of first page buffers $A_1$ to $A_N$, a second bank 320 including a plurality of second page buffers $B_1$ to $B_N$, and an address counter 330 for counting a bank address BADD, a first address ADD1<0:A> and a second address ADD2<0:A> in a period for performing a read operation.

Hereafter, the operation of the non-volatile memory device is described with reference to FIG. 3.

The operations of receiving a command and an address through an input/output pad (not shown in FIG. 3) and storing data in a plurality of page buffers $A_1$ to $A_N$ and $B_1$ to $B_N$ in this embodiment is the same as the operations described in the background section. Also, the operations of sequentially outputting the data of the first page buffers between a starting first page buffer $A_3$ and an ending first page buffer $A_{N-1}$ in response to the counted first address ADD1<0:A> and the operation of sequentially outputting the data of the second page buffers between a starting second page buffer $B_3$ and an ending second page buffer $B_{N-1}$ in response to the counted second address ADD2<0:A> are the same as the operations described in the background section. However, the method of counting the bank address BADD, the first address ADD1<0:A>, and the second address ADD2<0:A> in the address counter 330 in this embodiment of the present invention is different from the conventional technology, which is described hereafter.

When the period for performing a read operation begins (a 'W/R#' signal transitions to a logic low level), a clock CLK is enabled. The address counter 330 counts the first address ADD1<0:A> and the second address ADD2<0:A> by using the clock CLK from the time when the period for performing a read operation begins to the time when a command latch enable (CLE) signal and an address latch enable (ALE) signal are enabled together, which is referred to as a first time. In the period after the period for performing a read operation begins, but before the first time, the first address ADD1<0:A> and the second address ADD2<0:A> are simultaneously counted at a rising edge of the clock CLK.

After the first time, the first address ADD1<0:A> and the second address ADD2<0:A> are counted by using the bank address BADD. After the first time, the first address ADD1<0:A> is counted at a rising edge of a bank address BADD, and the second address ADD2<0:A> is counted at a falling edge of a bank address BADD.

Also, to maintain the value of an initial bank address BADD_INT until the first time, the bank address BADD is not counted before the first time. After the first time, the bank address BADD is counted in response to the clock CLK.

When the command latch enable (CLE) signal and the address latch enable (ALE) signal are disabled together, the clock CLK is disabled and the operations of counting the bank address BADD, the first address ADD1<0:A>, and the second address ADD2<0:A> are sequentially ended.

When the period for performing a read operation begins, the initial bank address BADD_INT and the column address ADD_INT<0:A> become the initial values of the bank address BADD and the first and second addresses ADD1<0:A> and ADD2<0:A>, respectively. The address counter 330 counts the first address ADD1<0:A> and the second address ADD2<0:A> in response to the clock CLK when a counting signal COUNT is disabled to a logic low level, and the address counter 330 counts the first address ADD1<0:A> and the second address ADD2<0:A> in response to the bank address BADD when the counting signal COUNT is enabled to a logic high level. The counting signal COUNT is a signal output from an OR gate that has the inputs of the 'W/R#' signal, the command latch enable (CLE) signal, and the address latch enable (ALE) signal.

When the non-volatile memory device is not in a period for performing a read operation, the data stored in the multiple first page buffers $A_1$ to $A_N$ and multiple second page buffers $B_1$ to $B_N$ does not have to be output in advance. Therefore, when the non-volatile memory device is not in a period for performing a read operation, the first address ADD1<0:A> and the second address ADD2<0:A> do not have to be counted in advance, and the operation is performed the same as the conventional technology.

According to the embodiment of the present invention, the clock CLK is enabled from the time when the period for performing a read operation begins until the CLE and ALE signals are disabled to end the counting operations. This enabled clock CLK period has no regard to the size relationship between the 'tWRCK' and the cycle of the source clock SCLK or the clock CLK. Thus, even though the bank address BADD is not counted, the first address ADD1<0:A> and the second address ADD2<0:A> are counted according to the clock CLK before the first time. Therefore, since the data to be outputted to a circuit outside of the non-volatile memory device is stored in a pipe latch in advance by advancing a data output time in the first page buffers $A_1$ to $A_N$ and the second page buffers $B_1$ to $B_N$, the technology of the present invention is more appropriate for high-speed operation than the conventional technology.

The technology of the present invention may be applied to a single bank operation. In a single bank operation, the address counter is designed to count an address in response to a clock before the first time and to count an address in response to a bank address after the first time.

Figure 4:
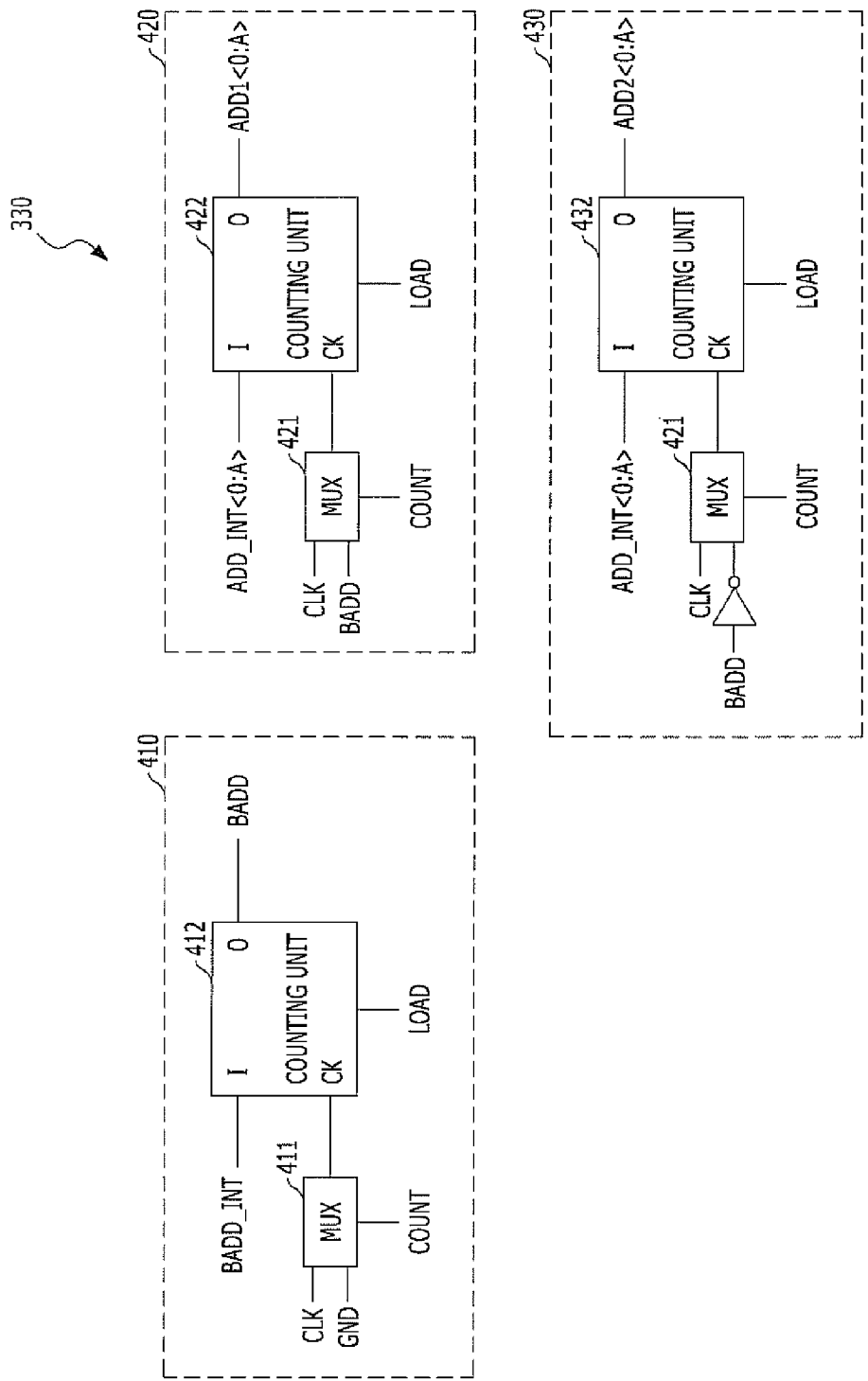
FIG. 4 is a block diagram of an address counter 330 shown in FIG. 3.

FIG. 4 is a block diagram of the address counter 330 shown in FIG. 3.

Referring to FIG. 4, the address counter 330 includes a bank address counting circuit 410, a first address counting circuit 420, and a second address counting circuit 430.

Hereafter, the operation of the address counter 330 is described with reference to FIG. 4.

The bank address counting circuit 410 counts the bank address BADD in response to a clock CLK when the counting signal COUNT is enabled and does not count the bank address BADD in response to a clock CLK when the counting signal COUNT is disabled. The initial bank address BADD_INT inputted to a counting unit 412 when a load signal LOAD is enabled becomes the initial value of the bank address BADD.

When the counting signal COUNT is enabled to perform the bank address BADD counting operation, a clock CLK is is selected by a multiplexing unit 411 and inputted to a clock terminal CK. Therefore, the counting unit 412 takes the initial bank address BADD_INT as the initial value and counts the bank address BADD at a rising edge of the clock CLK. Also, when the counting signal COUNT is disabled, a ground voltage GND is selected by the multiplexing unit 411 and is inputted to the clock terminal CK. Therefore, the counting unit 412 does not count the bank address BADD when the counting signal COUNT is disabled and maintains the initial bank address BADD_INT.

The first address counting circuit 420 counts the first address ADD1<0:A> in response to the bank address BADD when the counting signal COUNT is enabled, and counts the first address ADD1<0:A> in response to the clock CLK in a duration where the counting signal COUNT is disabled. When the load signal LOAD is enabled, a column address ADD_INT<0:A> inputted to a counting unit 424 becomes the initial value of the first address ADD1<0:A>.

When the counting signal COUNT is enabled to perform the first address ADD1<0:A> counting, a bank address BADD is selected by a multiplexing unit 421 and inputted to the clock terminal CK. Therefore, the counting unit 422 takes the column address ADD_INT<0:A> as the initial value and counts the first address ADD1<0:A> at a rising edge of the bank address BADD. Also, when the counting signal COUNT is disabled, a clock CLK is selected by the multiplexing unit 421 and inputted to the clock terminal CK. Therefore, the counting unit 422 takes the column address ADD_INT<0:A> as the initial value and counts the first address ADD1<0:A> at a rising edge of the clock CLK.

The structure and operation of the second address counting circuit 430 is almost the same as the structure and operation of the first address counting circuit 420. However, when the counting signal COUNT is enabled, a counting unit 432 counts the second address ADD2<0:A> at a falling edge of a bank address BADD. The bank address BADD may be inverted through an inverter before being input into the multiplexer to count the second address ADD2<0:A> at the falling edge of the bank address BADD.

Figure 5:
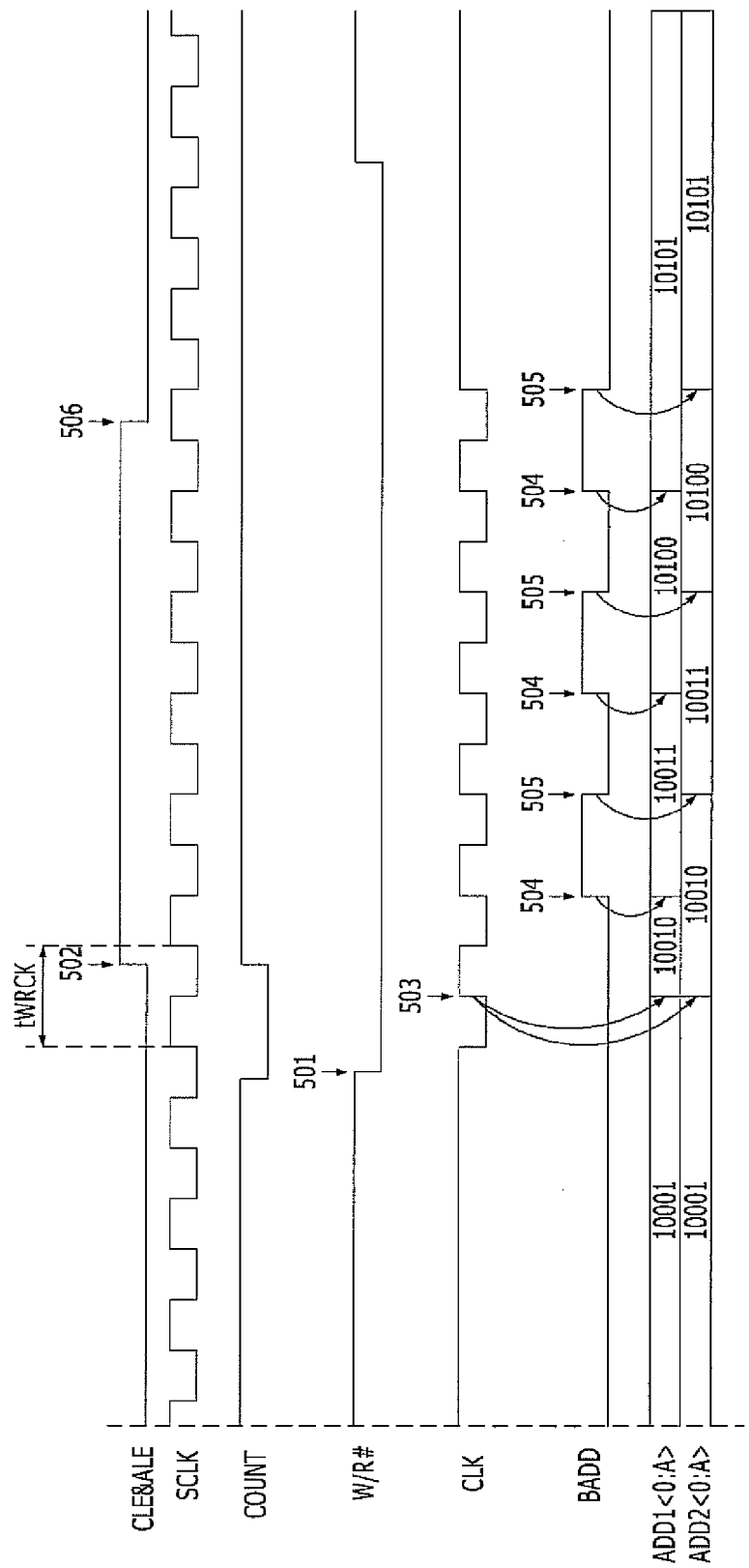
FIG. 5 is a waveform diagram illustrating the operation of a non-volatile memory device in accordance with an embodiment of the present invention.

FIG. 5 is a waveform diagram illustrating the operation of a non-volatile memory device in accordance with an embodiment of the present invention.

After a command and an address are inputted through an input/output pad, a period for performing a read operation begins at a falling edge 501 of a 'W/R#' signal. Here, when the 'W/R#' signal is in a logic low level, the non-volatile memory device is in a period for performing a read operation, and when the 'W/R#' signal is in a logic high level, the non-volatile memory device is in a period for performing a write operation.

Before the period for performing a read operation begins, a read command is applied first in a duration where a command latch enable (CLE) signal is enabled, and the initial value of a bank address BADD and a column address ADD_INT<0:A> are inputted in a duration where an address latch enable (ALE) signal is enabled.

When the period for performing a read operation begins (a 'W/R#' signal transitions to a logic low level), a clock CLK is enabled. The address counter 330 simultaneously counts the first address ADD1<0:A> and the second address ADD2<0: A> at a rising edge 503 of the clock CLK before an enabling time 502. Here, the clock CLK is generated by inverting a source clock SCLK and enabling the inverted source clock for a designated duration.

After the first time 502 in the period for performing a read operation, the bank address BADD is counted at a rising edge of the clock CLK. The first address ADD1<0:A> is then counted at a rising edge of a bank address BADD, and the second address ADD2<0:A> is counted at a falling edge of the bank address BADD.

The clock CLK is disabled in response to a latch disable time 506 when the command latch enable (CLE) signal and the address latch enable (ALE) are disabled to a logic low, and the operations of counting the bank address BADD, the first address ADD1<0:A>, and the second address ADD2<0:A> are sequentially ended.

FIG. 5 shows an operation when the initial bank address BADD_INT is '0' and the column address ADD_INT<0:A> is '10001'. The bank address BADD toggles between '0' and '1' while starting from '0'. The first address ADD1<0:A> and the second address ADD2<0:A> are counted from '10001' to '10101'. In FIG. 3, the page buffer designated by '10001' is the starting page buffer $A_3$ and $B_3$, and the page buffer designated by '10101' is the ending page buffer $A_{N-1}$ and $B_{N-1}$.

The non-volatile memory device in accordance with an embodiment of the present invention is appropriate for a high-speed operation regardless of the cycle of a clock, since it directly uses the clock and counts address in advance when the period for performing a read operation begins.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
   a first bank including a plurality of first page buffers;
   a second bank including a plurality of second page buffers; and
   an address counter configured to count a first address and a second address in response to a clock before a first time in a period for performing a read operation and count the first address and the second address in response to a bank address after the first time,
   wherein data of the first page buffers are sequentially outputted in response to the first address, and data of the second page buffers are sequentially outputted in response to the second address,
   wherein the first time indicates a time when a command latch enable signal and an address latch enable signal are enabled.

2. The non-volatile memory device of claim 1, wherein the address counter counts the first address and the second address at a rising edge of the clock before the first time, counts the first address at a rising edge of the bank address after the first time, and counts the second address at a falling edge of the bank address after the first time.

3. The non-volatile memory device of claim 1, wherein the address counter does not count the bank address before the first time, and counts the bank address in response to the clock after the first time.

4. The non-volatile memory device of claim 1, wherein the clock is enabled at a time when the period for performing a read operation begins, and the clock is disabled when the command latch enable signal and the address latch enable signal are disabled.

5. The non-volatile memory device of claim 1, wherein the address counter does not count the first address and the second address before the period for performing a read operation begins.

6. The non-volatile memory device of claim 1, wherein a column address inputted to an input/output pad is the initial values of the first address and the second address.

7. The non-volatile memory device of claim 1, wherein the address counter comprises a bank address counting circuit, a first address counting circuit, and a second address counting circuit.

8. The non-volatile memory device of claim 7, wherein the bank address counting circuit, first address counting circuit, and second address counting circuit each comprises a multiplexing unit and a counting unit.

9. The non-volatile memory device of claim 8, wherein the multiplexing unit of the bank address counting circuit selects the clock or a ground voltage signal to input into a clock terminal of the counting unit based on a counting signal.

10. The non-volatile memory device of claim 8, wherein the multiplexing unit of the first and second address counting circuits selects the clock or bank address to input into a clock terminal of the counting unit based on a counting signal.

11. The non-volatile memory device of claim 8, wherein the counting signal is the output of an OR gate based on the inputs of a read/write signal, a command latch enable signal, and an address latch enable signal.

12. A non-volatile memory device, comprising:
    a bank including a plurality of page buffers; and
    an address counter configured to count an address in response to a clock before a first time in a period for performing a read operation and count the address in response to bank address after the first time,
    wherein data of the page buffers are sequentially outputted in response to the address,
    wherein the first time indicates a time when a command latch enable signal and an address latch enable signal are enabled.

13. The non-volatile memory device of claim 12, wherein the address counter counts a first address and a second address together at a rising edge of the clock before the first time, counts the first address at a rising edge of the bank address after the first time, and counts the second address at a falling edge of the bank address.

14. The non-volatile memory device of claim 12, wherein the address counter does not count the bank address before the first time, and counts the bank address in response to the clock after the first time.

15. The non-volatile memory device of claim 12, wherein the clock is enabled at a time when the period for performing a read operation begins, and the clock is disabled when the command latch enable signal and the address latch enable signal are disabled.

16. The non-volatile memory device of claim 12, wherein the address counter does not count the address before the period for performing a read operation begins.

* * * * *